(12) United States Patent
Roth et al.

(10) Patent No.: US 8,447,581 B1
(45) Date of Patent: May 21, 2013

(54) GENERATING SIMULATION CODE FROM A SPECIFICATION OF A CIRCUIT DESIGN

(75) Inventors: David Roth, San Francisco, CA (US); Hem C. Neema, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 811 days.

(21) Appl. No.: 12/559,847

(22) Filed: Sep. 15, 2009

(51) Int. Cl.
*G06F 17/50* (2006.01)

(52) U.S. Cl.
USPC ............................................. 703/14; 716/104

(58) Field of Classification Search ...... 703/14; 716/104
See application file for complete search history.

(56) References Cited

U.S. PATENT DOCUMENTS 5,870,608 A * 2/1999 Gregory ........................ 717/131
5,937,190 A * 8/1999 Gregory et al. ............... 717/131

* cited by examiner

*Primary Examiner* — Dwin M Craig
(74) *Attorney, Agent, or Firm* — LeRoy D. Maunu; Lois D. Cartier

(57) ABSTRACT

During the elaboration and synthesis of a circuit design, a parse tree generally must be fully expanded to access memory resources and data of individual module instances in order to perform optimizations that will result in better runtime performance of generated simulation code. The present invention reduces memory requirements in generating simulation or emulation executable code by implementing a collapsed parse tree, where multiple instances of a module in a HDL design are represented by a single representative node in the parse tree.

20 Claims, 6 Drawing Sheets

GENERATING SIMULATION CODE FROM A SPECIFICATION OF A CIRCUIT DESIGN

FIELD OF THE INVENTION

The present invention generally relates to the elaboration, synthesis and simulation of high level circuit designs.

BACKGROUND

Due to advancements in processing technology, complex integrated circuits (ICs) can be designed using various levels of abstraction. Using a hardware descriptive language (HDL), circuits can be designed at the gate level, the register transfer level (RTL), and higher logical levels. When designing using an HDL, the design is often structured in an object oriented manner. The designer describes a module in terms of the behavior of a system describing signals that are generated and propagated through combinatorial modules from one set of registers to another set of registers. HDLs provide a rich set of constructs to describe the functionality of a module. Modules may be combined and augmented to form even higher level modules.

An HDL design can be synthesized to create a logical network list (netlist), which can be implemented within a particular programmable logic device. Alternatively, the HDL design can be simulated to determine whether the design will function as required using a logic simulator. A logic simulator is a software tool capable for performing functional and timing simulation of an HDL circuit design.

Before an HDL design can be synthesized into a netlist or simulated, the design must go through the preparatory processes of analysis and elaboration. In the analysis process, the HDL design is examined to determine if it contains syntax or semantic errors. If no errors are discovered, the analyzer creates an intermediate representation of each design module and stores the intermediate representations in a library.

In the elaboration process, the design is reduced to a collection of signals and processes. Each logic component is constructed and connections between logic components are established. This is generally done by parsing the design. For each instance of a design module encountered during parsing, a data structure is created for the instance and placed into a parse tree. The data structure implementing an instance contains the processes of the module, variables used by those processes, and variables representing input and output signals from the module instance. Memory is allocated to store the processes and signal variables and initial values that are assigned to the signal variables. The location or offset of the allocated memory is stored within the data structures. Following elaboration, executable simulation code is compiled or synthesized from the process data files stored in a process library using the memory addresses and initial values allocated and assigned to the module instances.

Due to the increasing complexity and size of HDL designs, the elaboration required for synthesis or simulation requires large amounts of memory. The present invention may address one or more issues introduced by current elaboration approaches.

SUMMARY

In one of the various contemplated embodiments of the invention, a process is provided for the generating of executable simulation code from a circuit design. A parse tree of the circuit design is first generated, wherein multiple instances of a module of the design are represented by a single representative parse node in the parse tree. For each instance of a module in the parse tree, an instance-specific data structure is created for the instance. A respective memory area is also allocated for the instance. The address of the allocated memory is stored in the instance-specific data structure. Data indicating connectivity between the instance and other instances is also stored in the instance-specific data structure of the instance. The representative parse node of the instance is then configured to refer to the respective instance specific data structure.

Executable simulation code is then generated by traversing the parse tree and, for each instance of a module represented in the parse tree, generating and storing simulation code of the instance using the connectivity data and the address memory area allocated to the module instance. To gain access to the connectivity data and the address memory area allocated to the module instance, the respective instance specific data structure is determined from the reference in the representative parse node. Once the instance specific data structure is determined, the connectivity data and the addresses of allocated memory are retrieved from the respective instance specific data structure and are used to generate and store the simulation code.

In another embodiment of the present invention, a system is provided for generating executable simulation code from a circuit design. The system includes a processor, memory, and storage coupled to a bus. The processor and memory are configured to generate a parse tree of the circuit design wherein multiple instances of a module are represented by a single representative node in the parse tree. The processor and memory are configured to create an instance specific data structure of the instance, allocate memory for the instance, and store the address of the allocated memory in the instance specific data structure. The processor and memory are also configured to store connectivity data in the instance specific data structure. The processor and memory are capable of configuring the representative parse-node of an instance to refer to the respective instance specific data structure of the instance.

The processor and memory are further configured to traverse the parse tree, and, for each instance of the module represented in the parse tree, to determine the respective instance specific data structure from the reference in the representative parse node and retrieve the connectivity data and address of allocated memory from the respective instance specific data structure. The processor and memory are also configured to generate and store simulation code of the module using the retrieved memory address of the module instance.

In another embodiment of the present invention, an article of manufacture is provided. The article includes a processor-readable storage medium configured with processor-executable instructions. When the instructions are executed by a processor, they cause the processor to generate a parse tree of the circuit design wherein multiple instances of a module are represented by a single representative parse-node in the parse tree.

The instructions additionally cause the processor to create an instance specific data structure for each instance of a module represented in the parse tree, allocate memory for the module instance, and store the memory address in the instance specific data structure. The instructions also cause the processor to store connectivity data in the instance specific data structure and configure the representative parse-node of the instance to refer to instance specific data structure of the instance.

The instructions additionally cause the processor to traverse the parse tree, and generate and store executable simulation code for each instance of the module represented in the parse tree. For each instance, the instructions cause the processor to determine the instance specific data structure of the instance and retrieve connectivity data and address of allocated memory from the determined instance specific data structure. The instructions then cause the processor to generate and store simulation code of the module instance using the retrieved memory address and connectivity data.

It will be appreciated that various other embodiments are set forth in the Detailed Description and Claims, which follow.

BRIEF DESCRIPTION OF THE DRAWINGS

FIG. 1-2 illustrates a block diagram of a corresponding un-expanded parse tree;

FIG. 2-1 illustrates a block diagram of an example expanded parse tree;

FIG. 2-2 illustrates the creation of parse tree nodes for each module instance, along with direct and indirect referencing of resources allocated to each instance of a module;

FIG. 3-1 illustrates a block diagram of an example unexpanded parse tree;

FIG. 3-2 shows an example implementation of the unexpanded tree handling of pointers in which the allocated resources of multiple module instances are referenced from the parse tree node;

FIG. 3-3 shows a second example implementation of the unexpanded tree handling of pointers in which the parse tree node points to a data structure which indexes and stores reference pointers to the resources of each module instance represented by the parse tree node;

DETAILED DESCRIPTION

During the elaboration and synthesis of a circuit design, a parse tree generally must be fully expanded to access memory resources and data of individual module instances in order to perform optimizations that will result in better runtime performance of generated simulation code. The present invention reduces memory requirements of the elaboration process by implementing a collapsed parse tree, where multiple instances of a module in a HDL design are represented by a single representative node in the parse tree.

In the elaboration process, the design is reduced to a collection of signals and processes. Each logic component is constructed and connections between logic components are established. This is generally done by parsing the design. For each instance of a design module encountered during parsing, a data structure is created for the instance and placed into a parse tree. Each instance data structure contains the processes of the module, variables used by those processes, and variables representing input and output signals from the module instance. Memory is allocated to store the processes and signal variables and initial values that are assigned to the signal variables. The location or offset of the allocated memory is stored within the data structures.

Following elaboration, the circuit may be optimized, and executable simulation code is compiled or synthesized from the process data files stored in a process library using the memory addresses and initial values allocated and assigned to the module instances.

Figure 1:
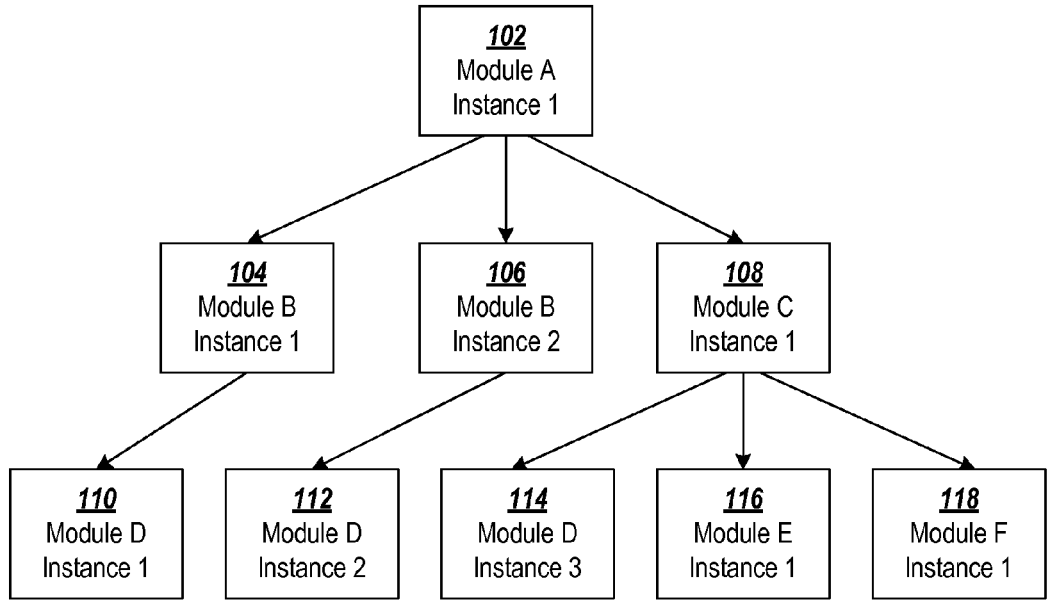
FIG. 1-1 illustrates a block diagram of an example of a fully expanded parse tree.
Figures 1, 2:
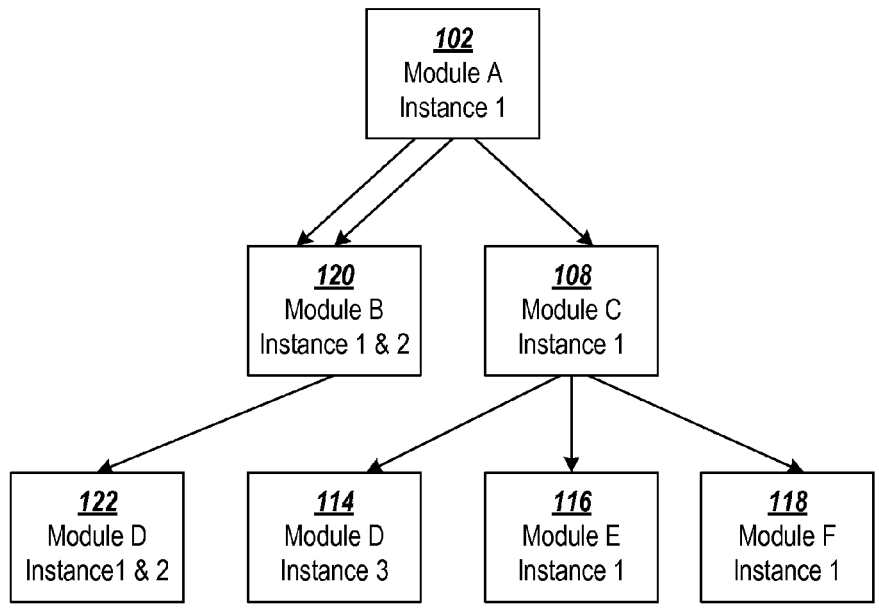
Figures 1, 2:
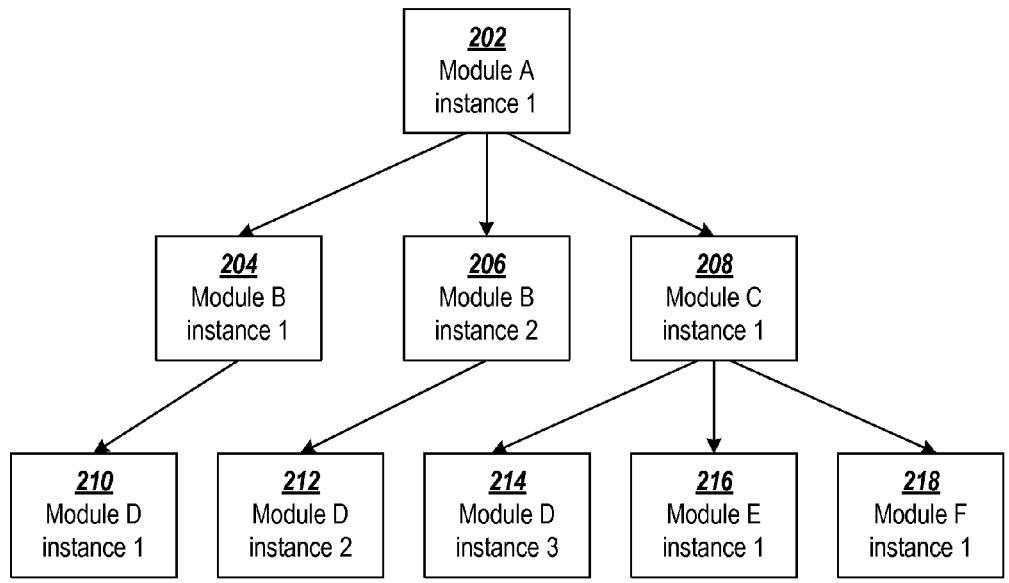
Figure 2:
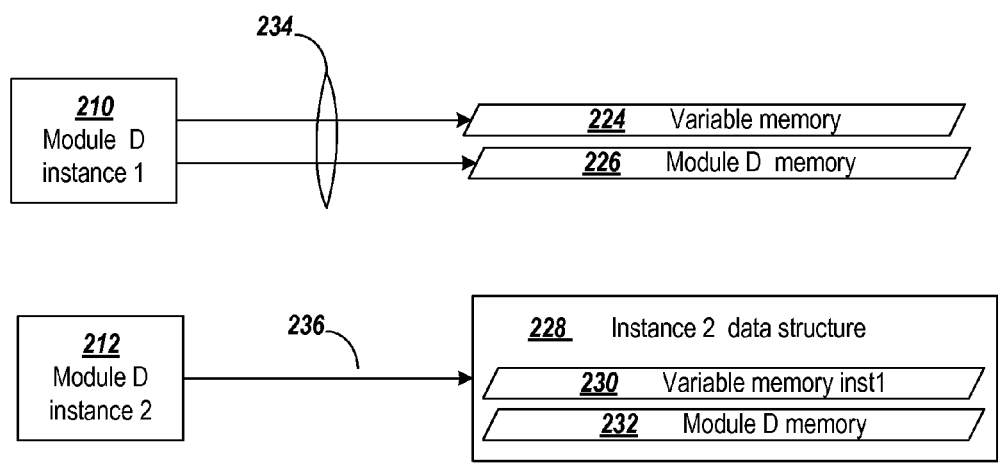

FIGS. 1-1 and 1-2 illustrate an example of a fully expanded parse tree and corresponding un-expanded parse tree. FIG. 1-1 shows the fully expanded parse tree. 104 and 106 are identical instances of the processes contained in module B. Each instance has a child node module D as a sub-module at 110 and 112 respectively. FIG. 1-2 shows the unexpanded parse tree in which multiple instances of a module are condensed into a single representation within the parse tree. Node 120 represents the multiple instances of module B at nodes 104 and 106 in the fully expanded tree of FIG. 1-1. Likewise, node 122 represents the multiple instances of module D at nodes 110 and 112 in the fully expanded tree of FIG. 1-1. FIG. 1-2 shows identical instances of the same parent node being represented by a single node.

It is understood that various implementations of the unexpanded parse tree will further condense the parse tree to have all identical instances represented by a single node regardless of their parent. For example, because nodes 110, 112 and 114 are identical in the fact that they are the same module and have the same child sub-modules, or lack thereof, they can all be represented by the same node in the un-expanded tree.

The data structure implementing a representative node in the parse tree is created with a single copy of the processes used by the module. For each instance represented by the representative node, memory is allocated for variables, the module signals and processes, and reference to the address or offset of the allocated memory is stored within the data structure. In this manner, memory for the node data structure and processes does not have to be allocated for each instance of the same module.

FIGS. 2-1 and 2-2 illustrate the resources needed to implement a fully expanded parse tree during elaboration and generation of a simulation executable. FIG. 2-1 shows a block diagram model of a fully expanded parse tree with identical instances of module D at 210 and 212. FIG. 2-2 shows a block diagram model of the resources needed to implement nodes 210 and 212 in the fully expanded parse tree. During elaboration, each instance must be allocated resources such as memory for the process, memory for variables to hold the initial values of input and output ports, memory to store connectivity between the component instances, etc. In the example in FIG. 2-2, each instance of the module is allocated variable memory 224 and 230 and memory for the module D at 226 and 232. With the fully expanded tree, two distinct parse tree nodes, 210 and 212, are utilized to refer to the allocated resources. The implementation of each node requires the creation of an underlying data structure 210 and 212 and pointers 234 and 236 that require memory. Each node in the parse tree is a data structure that refers to allocated resources either directly or indirectly. In this example, node 210 is implemented by a data structure that refers to resources 224 and 226 of the module instance directly.

Generally, the parse tree node does not maintain reference pointers to the resources of each instance directly. Rather, resources are organized as implemented by node 212. The resources of each module instance 230 and 232 are contained within an instance specific data structure object 228. The parse tree node 212 maintains a single reference pointer 236 to the instance specific data structure object 228. For simplicity, the indirect implementation of resource reference, as illustrated by node 212 is used in all further examples and illustrations herein. It is understood that any claim or description of a reference pointer to an instance specific data structure is applicable to both direct and indirect methods of reference described above.

Figures 1, 3:
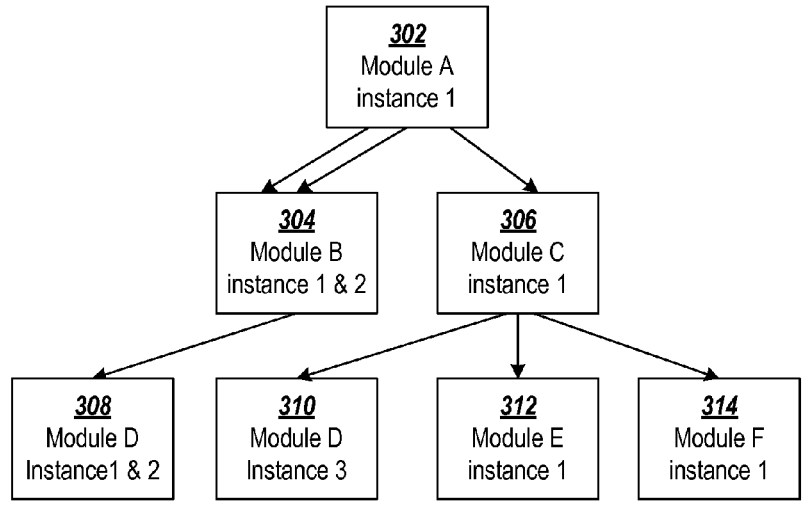
Figures 2, 3:
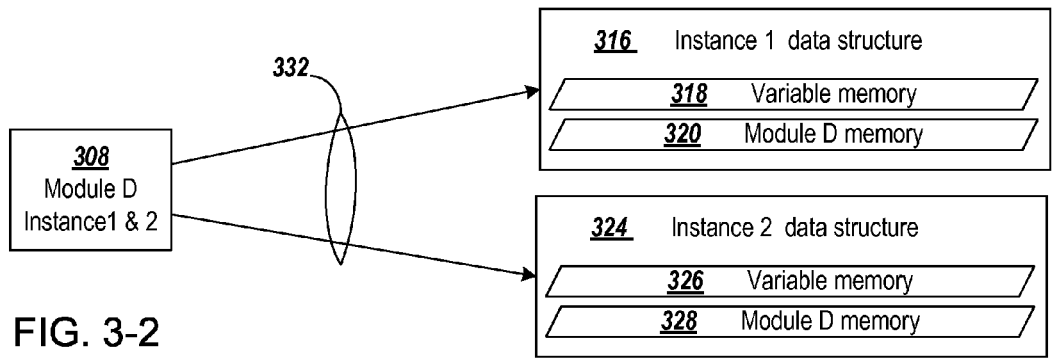
Figure 3:
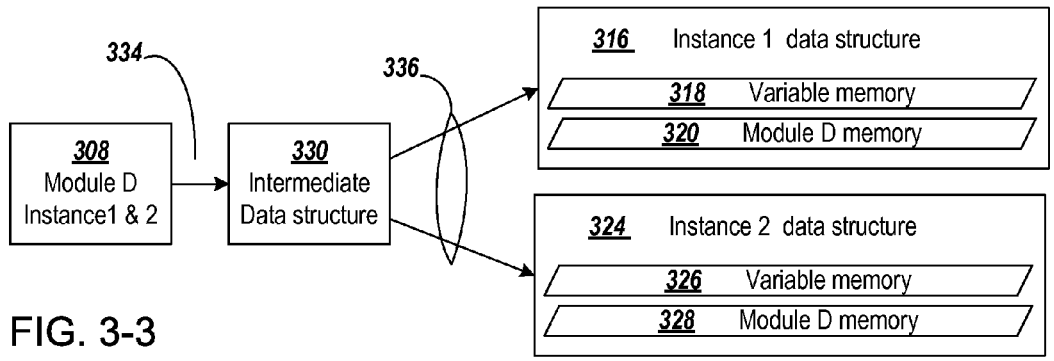

FIGS. 3-1, 3-2 and 3-3 illustrate the resources needed to implement an unexpanded parse tree in accordance with several embodiments of the present invention. FIG. 3-1 illustrates a block diagram model of an unexpanded parse tree which corresponds to the fully expanded tree shown in FIG. 2-1. Multiple instances of module B have been condensed into representative node 304 and multiple instances of module D have been condensed into representative node 308. FIG. 3-2 illustrates a block diagram of one implementation of a portion of the unexpanded tree in accordance with several embodiments of the present invention. Representative node 308 stores reference pointers 332 to the instance specific data structures, 316 and 324, of each module instance represented by representative node 308. The instance-specific data structures 316 and 324 contain reference pointers to resources 318, 320, 326 and 328 allocated to the module instances. Memory is saved during the elaboration process because only one node is needed to represent multiple instances within the parse tree. A significant memory reduction, possibly many hundreds of megabytes depending on the size of a design, can be achieved by avoiding the necessity of expanding the same design into a fully expanded parse tree over and over again. The memory savings are particularly large when dealing with timing based simulations where the same design is instantiated thousands of times.

Alternatively, the implementing data structure of a representative node need not store references to the instance specific data structures internally. An external intermediate data structure or list may be used to store and retrieve the addresses or offsets of allocated memory for the variables of each module instance. The representative node in the parse tree need only implement one address or reference pointer to a single intermediate data structure for all module instances.

FIG. 3-3 illustrates a block diagram of another implementation of a portion of the unexpanded tree in accordance with several embodiments of the present invention. Similar to FIG. 3-2, a single representative node 308 is created for the multiple instances, resources 318, 320, 326 and 328 are allocated for the module instances and the resources stored in instance specific data structures 316 and 324. However, representative node 308 does not refer to the instance specific data structure directly with reference pointers. Rather, the representative node 308 refers to an intermediate data structure 330 that is used to index and refer to the instance specific data structures 316 and 324 of the module instances represented by the representative node. Like the implementation in FIG. 3-2, memory is saved by creating only a single node in the parse tree for all instances of the same module.

The intermediate data structure implementation of FIG. 3-3 is especially useful when the data structure implementing the parse tree nodes does not support multiple reference pointers needed to refer to multiple instance specific data structures. In such a scenario, a programmer may be unable to modify the data structure if the source code is unavailable. The intermediate data structure 330 allows a parse tree node that does not support multiple reference pointers to act as a representative node for multiple module instances. The representative parse tree node 308 has a reference pointer 334 to the intermediate data structure 330 which stores and indexes reference pointers 336 to the instance specific data structures 316 and 324 and the resources allocated to each module instance represented by the representative node.

Figure 4:
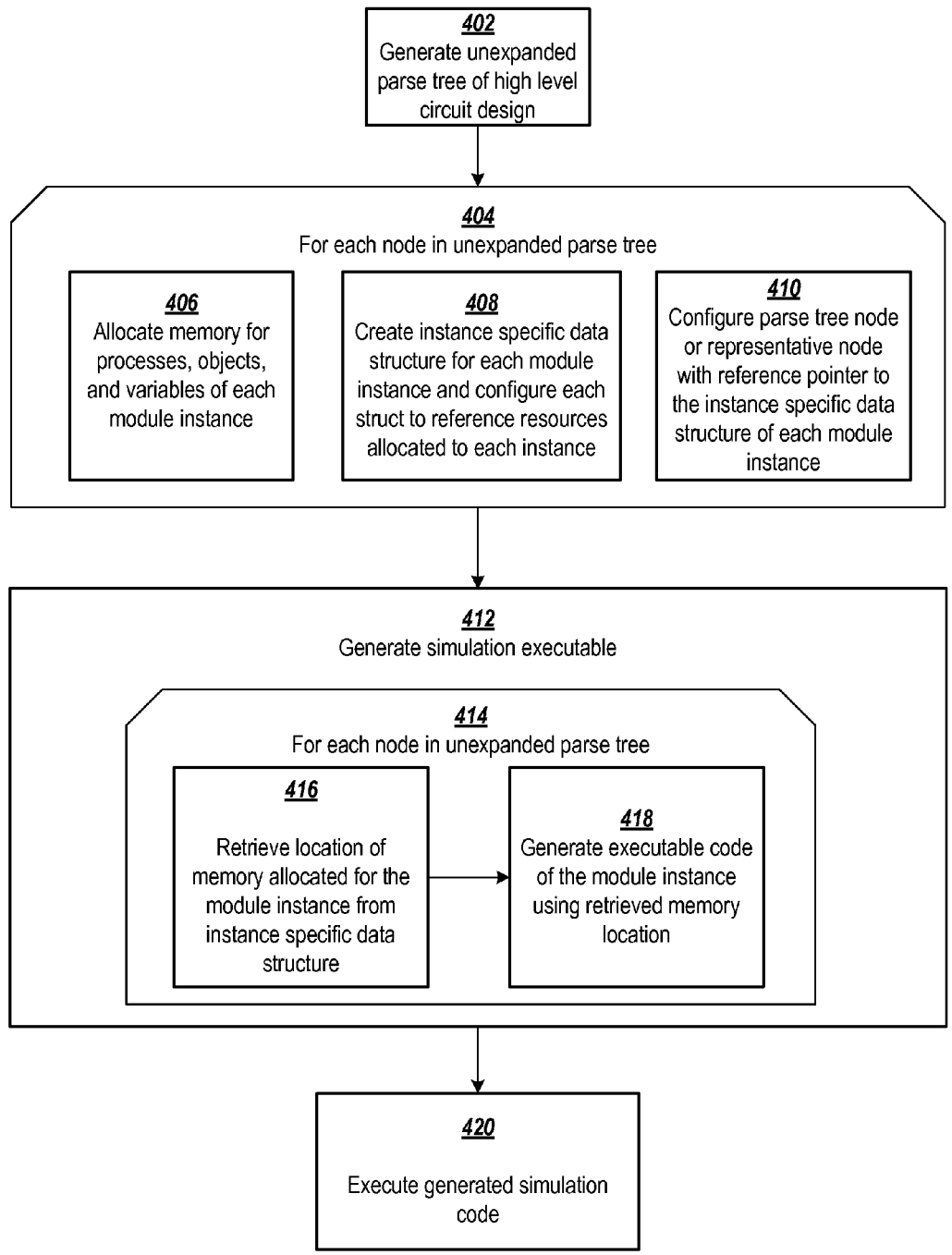
FIG. 4 illustrates a flow diagram of a process of elaboration and simulation, in accordance with one or more embodiments of the invention, wherein reference pointers are stored internally within parse tree nodes.

FIG. 4 illustrates a flow diagram of a process of elaboration and simulation of a circuit design in accordance with several embodiments of the invention. An unexpanded parse tree is generated at step 402 by parsing the circuit design code and creating a parse tree node for each module in the design. Identical instances of a module are represented by a single representative node. For each parse tree node, at step 404, resources are allocated for each module instance represented by the node.

For each module instance resources, such as processes, objects, variables, or connectivity data, memory is allocated for the each module instance at step 406. Initial values are assigned to the signal variables (not shown). An instance specific data structure is created for each module instance at 408. Each instance specific data structure is configured with reference pointers to the resources allocated to the respective module instance at step 408. The parse tree node, or representative node in the case of multiple module instances, is configured with reference pointers to the instance specific data structure of each module instance represented by the parse tree node at step 410.

The circuit design is compiled or synthesized into executable form at step 412. The parse tree is traversed and for each module instance in the circuit 414 the compiler retrieves the memory locations of the resources allocated to the module instance at step 416. The compiler generates executable code 420 for the module instance from the module process and the retrieved memory locations used by the process at step 418.

Figure 5:
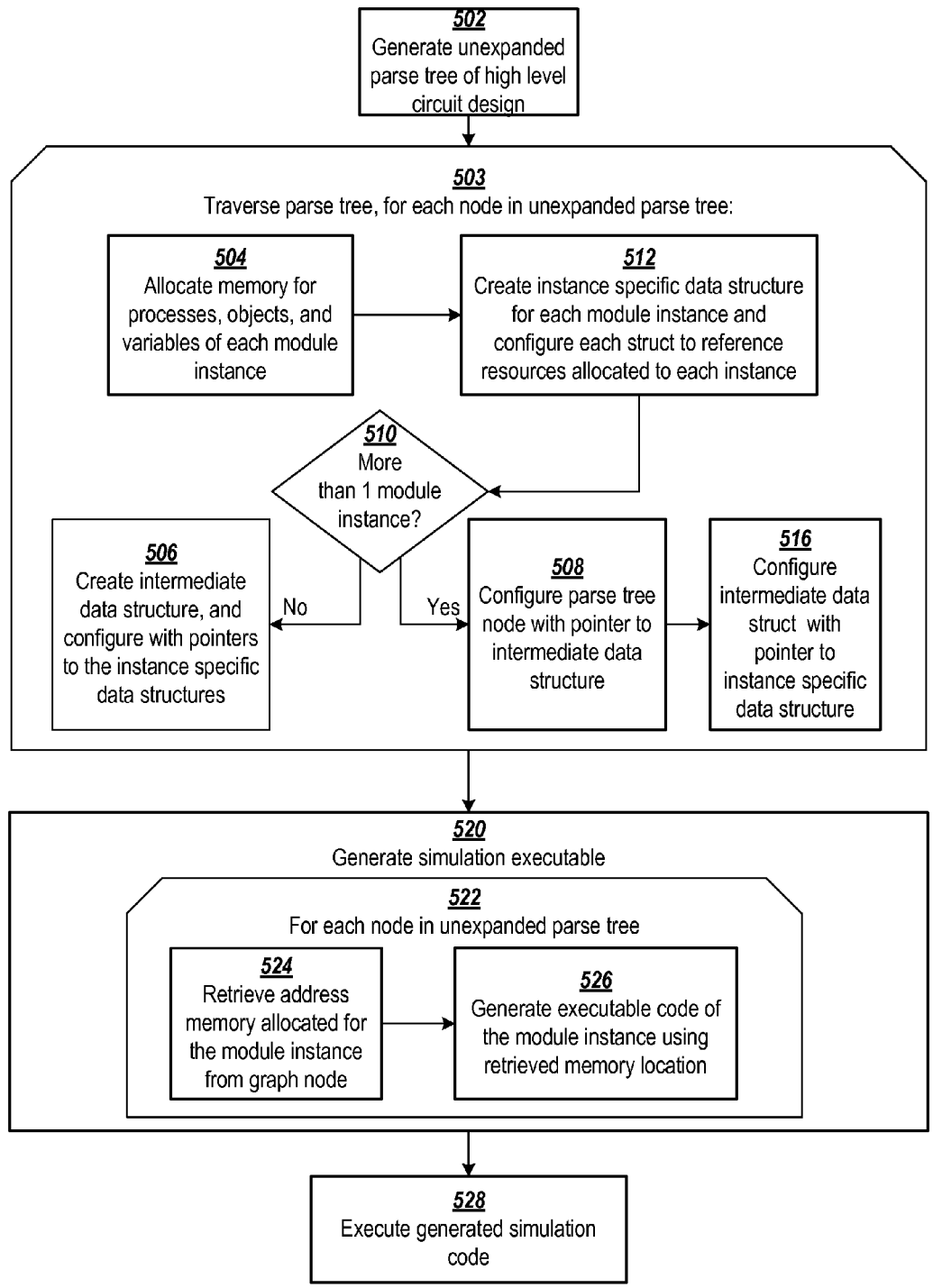
FIG. 5 illustrates a flow diagram of a process of elaboration and simulation, in accordance with one or more embodiments of the invention, wherein reference pointers are stored in an external data structure.

FIG. 5 illustrates a flowchart diagram of a second process of elaboration and simulation using an unexpanded parse tree in accordance with several embodiments of the invention. An unexpanded parse tree is generated at step 502 by parsing the circuit design code and creating a parse tree node for each module in the design. Identical instances of a module are represented by a single representative node. The parse tree is traversed and for each parse tree node at 503, resources are allocated for each module instance represented by the node at step 504. For each module instance, resources, such as memory for processes, objects, variables, or connectivity data, is allocated at step 504. Initial values may also be assigned to the signal variables (not shown). An instance specific data structure is created for each module instance at 512. Each instance specific data structure is configured with reference pointers to the resources allocated to the respective module instance at step 512.

At step 510, it is determined whether the parse tree node represents multiple module instances. If only one module instance is represented, the parse tree node is configured with a reference pointer to the instance specific data structure corresponding to the module instance at step 506. If the node is a representative node, in which more than one module instance is represented by the node, an intermediate data structure is created at step 508 and configured to index reference pointers to each of the instance specific data structures corresponding to the module instances represented by the representative parse tree node. Once an intermediate data structure is created, the representative parse tree node is configured with a reference pointer to the intermediate data structure at step 516.

The circuit design is compiled or synthesized into executable form at step 520. The parse tree is traversed and for each module instance in the circuit at step 522 the compiler retrieves the memory locations of the resources allocated to the module instance at step 524. The compiler generates executable code 528 for the module instance from the processes of the module and the retrieved memory locations used by the processes at step 526.

Prior to compilation or synthesis into executable form, connectivity data indicating physical connections between module instance components may be analyzed and modified to optimize the generated simulation code. Optimization techniques typically are employed in the conversion of the behavioral description to the gate level description. Additionally, the synthesis process maps a design to a library of circuits implementing various processes contained in the modules. Each module represents a circuit element that is available in a particular implementation technology, and the module library is a collection of these modules. The library comprises primitive circuits, such as inverters, NAND gates, NOR gates as well as more complex circuits that have been optimized for different operating conditions.

In synthesis optimization, for example, each module instance component may be optimized according to several factors including: reduction of propagation delay to optimize speed of the circuit or reduce operating voltage of the component to reduce power consumption. The overall circuit can be further optimized by looking at the connectivity between components. For example, if two components are connected in series, and the first can only operate at a maximum clock cycle of 100 MHz, it would not be advantageous to optimize the second component to operate at a high clock cycle as it would not increase throughput of the circuit.

Connections may also be analyzed to optimize simulation code generated. Because simulation is more abstracted from the lower level implementation, connections between instances can be analyzed to identify unused or inefficient portions of the circuit. For example, if a group of connected instances are written to, but are never read from and no process is sensitive to the output generated by the group, then there is no need for the simulation to run calculations to simulate those instances as it will have no effect on the simulation output. Likewise, if a group of connected instances are never written to, the generated output of the group is constant and can be represented in the simulation by the constant value or generated waveform. Additionally, with a full view of the connections between instances, the instances can be laid out in memory to take advantage of locality to improve cache performance.

Figure 6:
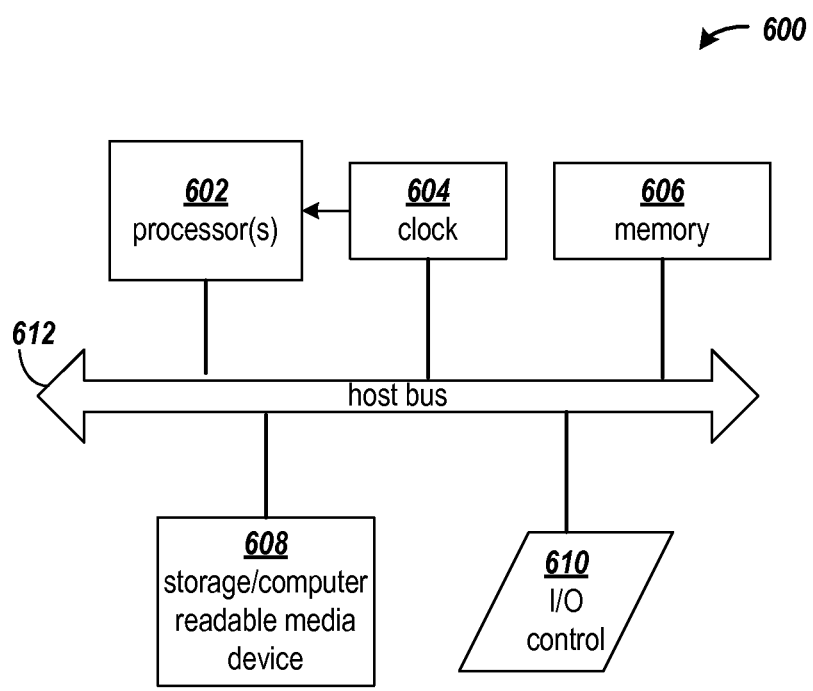
FIG. 6 illustrates a block diagram of a computing arrangement for implementing a system for elaboration and simulation of a circuit design in accordance with various embodiments of the invention.

FIG. 6 is a block diagram of an example computing arrangement on which the processes described herein may be implemented using a general purpose processor. Those skilled in the art will appreciate that various alternative computing arrangements, including one or more processors and a memory arrangement configured with program code, would be suitable for hosting the processes and data structures and implementing the algorithms of the different embodiments of the present invention. The computer code, comprising the processes of the present invention encoded in a processor executable format, may be stored and provided via a variety of computer-readable storage media or delivery channels such as magnetic or optical disks or tapes, electronic storage devices, or as application services over a network.

Processor computing arrangement 600 includes one or more processors 602, a clock signal generator 604, a memory unit 606, a storage unit 608, and an input/output control unit 610 coupled to host bus 612. The arrangement 600 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 602 may be one or more general purpose processors, or a combination of one or more general purpose processors and suitable co-processors, or one or more specialized processors (e.g., RISC, CISC, pipelined, etc.).

The memory arrangement 606 typically includes multiple levels of cache memory and a main memory. The storage arrangement 608 may include local and/or remote persistent storage such as provided by magnetic disks (not shown), flash, EPROM, or other non-volatile data storage. The storage unit may be read or read/write capable. Further, the memory 606 and storage 608 may be combined in a single arrangement.

The processor arrangement 602 executes the software in storage 606 and/or memory 608 arrangements, reads data from and stores data to the storage 606 and/or memory 608 arrangements, and communicates with external devices through the input/output control arrangement 610. These functions are synchronized by the clock signal generator 604. The resource of the computing arrangement may be managed by either an operating system (not shown), or a hardware control unit (not shown).

The present invention is thought to be applicable to a variety of systems for a data bus controller. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of generating executable simulation code from a circuit design, the method comprising:
   generating a parse tree of the circuit design wherein multiple instances of a module of the circuit design are represented by a single representative parse node in the parse tree;
   for each instance of the module represented in the parse tree:
      creating an instance-specific data structure for the instance;
      allocating a respective memory area for the instance;
      storing an address of the respective memory area allocated to the instance in the instance-specific data structure;
      storing data in the instance-specific data structure of the instance indicating connectivity between the instance and other instances; and
      configuring the representative parse node of the instance to refer to the respective instance specific data structure of the instance; and
   generating executable simulation code by a processor, by:
      traversing the parse tree; and
      for each instance of the module represented in the parse tree:
         determining the respective instance specific data structure from the reference in the representative parse node;
         retrieving the connectivity data and the address memory area allocated to the instance from the respective instance specific data structure; and generating and storing simulation code of the instance using the retrieved memory addresses and connectivity data.

2. The method of claim 1, further comprising storing initial simulation input data of each instance of the module in the allocated memory locations of the instance.

3. The method of claim 1, wherein the representative parse-node is configured to refer directly to instance specific data structures of the respective instances with reference pointers that are stored in the representative node.

4. The method of claim 1, further comprising:
creating an intermediate data structure for each representative node;
configuring the intermediate data structure node to refer to the instance specific data structures respective to the instances represented by the representative node by means of reference pointers stored in the intermediate data structure; and
configuring the representative parse-node to refer to the instance specific data structures by means of a reference pointer stored in the representative parse-node.

5. The method of claim 1, further comprising:
analyzing the connectivity data of the instances of the modules of the circuit design; and
modifying connectivity of the graph-nodes to optimize the simulation code that is generated.

6. The method of claim 5, further comprising:
identifying a group of connected instances that do not generate output to any instance outside the group; and
generating and storing simulation code of the circuit design, wherein the generated simulation code does not include instances of the identified group.

7. The method of claim 5, further comprising:
identifying a group of connected instances that do not receive input from any instances outside the group; and
replacing the group with constant value generators corresponding to each output of the group.

8. The method of claim 5, further comprising:
selecting an optimized module from a database, wherein the optimized module is logically equivalent to one or more connected instances of the module; and
replacing the one or more connected instances of the module with the optimized module.

9. A system for generating executable simulation code from a circuit design, the system comprising:
a processor;
a bus coupled to the processor;
a memory unit coupled to the bus; and
a storage unit coupled to the bus;
wherein the processor and the memory are configured to generate a parse tree of the circuit design wherein multiple instances of a module of the circuit design are represented by a single representative node in the parse tree;
wherein, for each instance of the module represented in the parse tree, the processor and the memory are further configured to:
create an instance specific data structure for the instance;
allocate memory for the instance;
store the address of the memory allocated to the instance in the respective instance specific data structure;
store data in the respective instance specific data structure of the instance indicating connectivity of datapath signals between the instance and other instances; and
configure the representative parse-node of the instance to refer to the respective instance specific data structure of the instance; and
wherein the processor and the memory are further configured to:
traverse the parse tree; and
for each instance of the module represented in the parse tree:
determine the respective instance specific data structure from the reference in the representative parse node;
retrieve the connectivity data and address of respective memory area allocated to the instance from the respective instance specific data structure; and
generate and store simulation code of the module using the retrieved memory address of the instance.

10. The system of claim 9, wherein the processor and the memory are further configured to store initial simulation input data of each instance of the module in the allocated memory locations of the instance.

11. The system of claim 9, wherein the processor and the memory are further configured to configure the representative parse-node to refer to the respective instance specific data structures of the instances represented by the representative parse-node by means of reference pointers which are stored in the representative node.

12. The system of claim 9, wherein the processor and the memory are further configured to:
create an intermediate data structure for each representative node;
configure the intermediate data structure node to refer to the instance specific data structures respective to the instances represented by the representative node by means of reference pointers stored in the intermediate data structure; and
configure the representative parse-node to refer to the instance specific data structures by means of a reference pointer to the intermediate data structure.

13. The system of claim 9, wherein the processor and the memory are further configured to:
analyze the connectivity data of the instances of the modules of the circuit design; and
modify the connectivity of the graph-nodes to optimize simulation code that is generated.

14. An article of manufacture, comprising:
a processor-readable non-transitory storage medium configured with processor-executable instructions causing one or more processors to process a circuit design, the instructions when executed by a processor causing the processor to perform operations including:
generating a parse tree of the circuit design wherein multiple instances of a module of the circuit design are represented by a single representative parse-node in the parse tree; and
for each instance of the module represented in the parse tree:
creating an instance specific data structure for the instance;
allocating a respective memory area for the instance;
storing an address of the respective memory area allocated to the instance in the respective instance specific data structure of the instance;
storing data in the respective instance specific data structure of the instance indicating connectivity of datapath signals between the instance and other instances;

configuring the representative parse-node of the instance to refer to the respective instance specific data structure of the instance; and generating executable simulation code by performing the operations of:

traversing the parse tree, and for each instance of the module represented in the parse tree, retrieving the connectivity data and address of respective memory area allocated to the module from the respective instance specific data structure, and generating simulation code of the instance using the retrieved memory address and connectivity data; and storing the generated simulation code.

15. The article of manufacture of claim 14, wherein the instructions when executed by a processor further cause the processor to store initial simulation input data of each instance of a module in the allocated memory locations of the instance.

16. The article of manufacture of claim 14, wherein the instructions when executed by a processor further cause the processor to configure the representative parse-node to refer directly to instance specific data structures of the respective instances by means of reference pointers which are stored in the representative parse-node.

17. The article of manufacture of claim 14, wherein the instructions when executed by a processor further cause the processor to:

create an intermediate data structure for each representative node;

configure the intermediate data structure node to refer to the instance specific data structures respective to the instances represented by the representative node by means of reference pointers stored in the intermediate data structure; and configure the representative parse-node to refer to the instance specific data structures by means of a reference pointer stored in the representative parse-node.

18. The article of manufacture of claim 14, wherein the instructions when executed by a processor further cause the processor to:

analyze the connectivity data of the instances of the modules of the circuit design; and modify the connectivity of the graph-nodes to optimize simulation code that is generated.

19. The article of manufacture of claim 18, wherein the instructions when executed by a processor further cause the processor to:

identify a group of connected instances that do not generate output to any instance outside the group; and generate and store simulation code of the circuit design, wherein the generated simulation code does not include instances of the identified group.

20. The article of manufacture of claim 18, wherein the instructions when executed by a processor further cause the processor to:

identify a group of connected instances that do not receive input from any instances outside the group; and replace the group with constant value generators corresponding to each output of the group.

* * * * *